United States Patent [19]

Lim et al.

[11] Patent Number: 5,728,493
[45] Date of Patent: Mar. 17, 1998

[54] ANTIREFLECTION MASK FOR CONTACT HOLE OPENING

[75] Inventors: Chet Ping Lim; Ron-Fu Chu, both of Singapore, Singapore

[73] Assignee: Chartered Semiconductor Manufacturing PTE LTD, Singapore, Singapore

[21] Appl. No.: 725,809

[22] Filed: Oct. 4, 1996

[51] Int. Cl.$^6$ .................................................. G03F 9/00
[52] U.S. Cl. .................................................. 430/5
[58] Field of Search ................ 430/5, 323, 324, 430/312

[56] References Cited

U.S. PATENT DOCUMENTS

| | | | |
|---|---|---|---|
| 5,126,289 | 6/1992 | Ziger | 430/318 |
| 5,477,058 | 12/1995 | Sato | 250/548 |
| 5,536,603 | 7/1996 | Tsuchiya et al. | 430/5 |

*Primary Examiner*—S. Rosasco
*Attorney, Agent, or Firm*—George O. Saile; Stephen B. Ackerman; Larry J. Prescott

[57] ABSTRACT

An antireflection mask and method of using the antireflection mask to form contact holes for an integrated circuit wafer are described. The antireflection mask has a patterned opaque layer formed on a transparent mask substrate. The patterned opaque layer has first openings for exposing photoresist in regions where the photoresist is thicker and second openings for exposing photoresist in regions where the photoresist is thinner. A patterned layer of antireflection material having a light transmittance of less than 100% is formed over the second openings but not over the first openings. Light is passed through the mask to expose a layer of photoresist. The light exposing the thinner photoresist regions is attenuated by the antireflection material thereby compensating for variations in photoresist thickness. In addition the antireflection material reduces reflections from the patterned opaque layer of the mask.

18 Claims, 2 Drawing Sheets

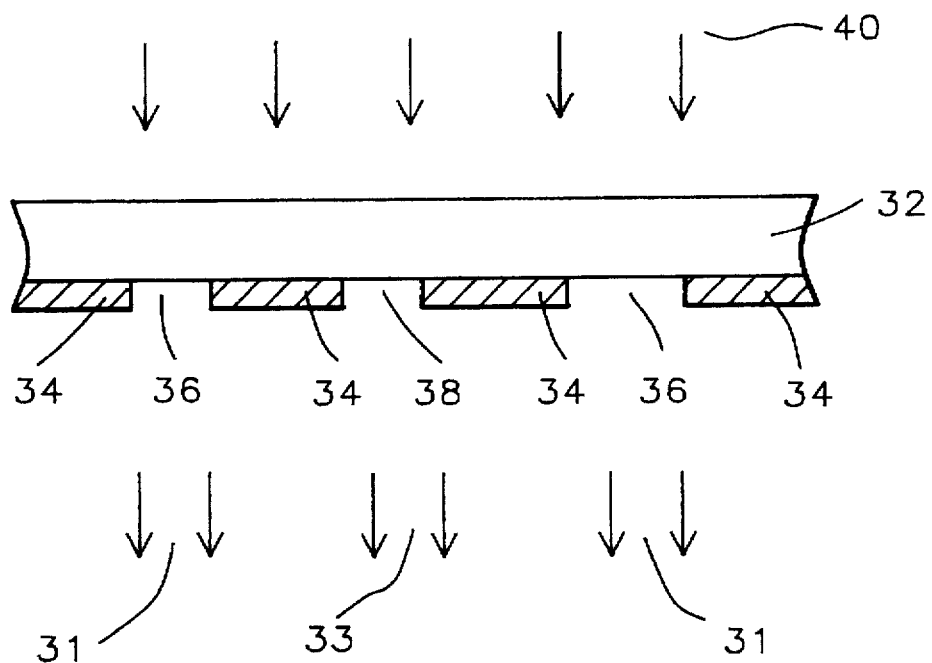
FIG. 4 - Prior Art
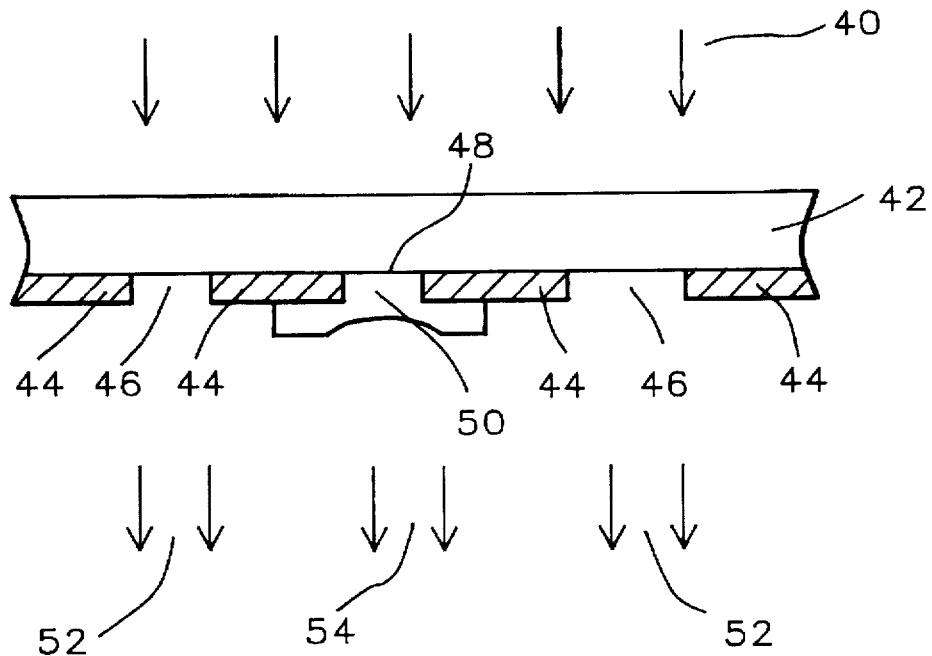
FIG. 5

ANTIREFLECTION MASK FOR CONTACT HOLE OPENING

BACKGROUND OF THE INVENTION

(1) Field of the Invention

The invention relates to an antireflection mask used to expose a layer of photoresist having thickness variations. An antireflection coating having a light transmittance of less than 100% is used in those regions of the mask used to expose thinner photoresist regions.

(2) Description of the Related Art

As dimensions in integrated circuit wafers become smaller it becomes more difficult to achieve adequate dimensional tolerance control using optical lithographic methods. There has been considerable work done to improve the capability of masks to achieve increased dimensional control.

U.S. Pat. No. 5,477,058 to Sato describes an attenuated phase shifting mask formed of a layer of halftone phase shifting material. The masks described use reticle alignment marks in the mask kerf to aid mask alignment.

The invention of this Patent Application describes a mask using a patterned layer of antireflection material which has a light transmittance of less than 100%. The invention also describes a method of using the antireflection mask to expose a layer of photoresist on an integrated circuit wafer. The antireflection material is used to attenuate the light exposing thinner regions of the layer of photoresist thereby providing compensation for the thickness variation of the layer of photoresist.

SUMMARY OF THE INVENTION

In the manufacture of integrated circuit wafers isolation regions 12, such as field oxide regions, are used to separate different active regions 8 of the wafer, see FIG. 1. Metal electrodes 16 18 are then formed over these active 8 and isolation regions 12 and covered by a layer of dielectric 14. It is frequently necessary to form contact holes in the dielectric layer 14 in order to form contacts to the metal electrodes. The formation of the field oxide isolation regions 12 causes surface irregularities in the integrated circuit wafer 10. These surface irregularities cause the electrodes 18 formed over the field oxide regions 12 to be on a different plane than the electrodes 16 formed over the active regions 8.

In order to form contact holes a layer of photoresist 20 is formed over the dielectric layer 14, see FIG. 2. Due to these surface irregularities caused by the formation of the field oxide regions, the thickness 24 of the photoresist directly over the electrodes 18 formed over the field oxide regions 12 is less than the thickness 22 of the photoresist directly over electrodes 16 formed over the active regions 8.

The photoresist is then exposed using a tool such as a 5 X stepper. As shown in FIG. 3, a mask 60 is illuminated with a beam of light 40. The light 64 passing through the mask 60 is focussed on the wafer 66 and the photoresist is exposed.

FIG. 4 shows a conventional mask used for exposing the photoresist in preparation for forming contact holes. A pattern formed in a layer of opaque material 34 such as chrome is formed on a transparent mask substrate 32 formed of a material such as quartz. The pattern in the opaque material provides first mask openings 36 for exposing the photoresist over the active regions of the wafer and second mask openings 38 for exposing the photoresist over the isolation regions of the substrate. The mask is illuminated with a beam of light 40 and light 31 passing through the first mask openings 36 exposes the photoresist over the active regions of the wafer and light 33 passing through the second mask openings 38 exposes the photoresist over the isolation regions of the wafer.

As dimensions decrease to the sub micron range there are two problems encountered in using the conventional mask. First, as previously described, the photoresist thickness 24 over the isolation regions 12 of the wafer is less than the photoresist thickness 22 over the active regions 8 of the wafer, see FIG. 2. However, the light passing through the first mask openings 36 is the same as the light passing through the second mask openings 38, see FIG. 4. The different thicknesses of photoresist will result in different openings in the photoresist after developing and this will cause loss of dimensional control. Second, reflections from the chrome mask material will cause interference patterns which will also cause loss of dimensional control.

It is a principle object of this invention to provide an antireflection mask which will compensate for photoresist thickness variation and avoid reflections from the opaque mask material, thereby improving dimensional control.

It is another principle objective of this invention to provide a method of exposing an integrated circuit wafer using an antireflection mask which will compensate for photoresist thickness variation and avoid reflections from the opaque mask material, thereby improving dimensional control.

These objectives are achieved by using an antireflection material which has a light transmittance of less than 100% for wavelengths of light used to illuminate the mask. The antireflection material is used to cover those parts of the mask used to expose the thinner photoresist over the isolation regions of the wafer. There is no antireflection material over those parts of the mask used to expose the thicker photoresist over the active regions of the wafer. The antireflection material both reduces reflections from the opaque mask material and compensates for the photoresist thickness variation. This provides improved dimensional control for the developed photoresist which will be used to form the features, such as contact holes, on the wafer.

BRIEF DESCRIPTION OF THE DRAWINGS

FIG. 4 shows a cross section view of a conventional mask used to expose a layer of photoresist on an integrated circuit wafer.

FIG. 5 shows a cross section view of the antireflection mask of this invention.

DESCRIPTION OF THE PREFERRED EMBODIMENTS

Figure 1:
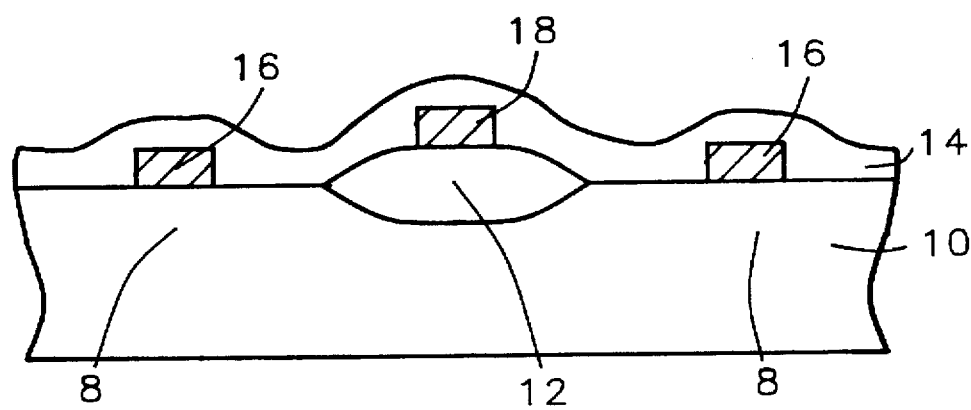
FIG. 1 shows a cross section view of an integrated circuit wafer having active regions and isolation regions.

FIG. 1 shows an integrated circuit wafer 10 having active regions 8 separated by isolation regions 12, such as field oxide. The detail of the active regions 8 is not shown. Only one isolation region 12 is shown however, it will be readily apparent to those skilled in the art that there can be a number of isolation regions in the full integrated circuit wafer 10. The isolation regions 12 are typically field oxide regions which are formed on the integrated circuit wafer. As the field oxide regions are formed the field oxide extends above the surface of the wafer causing a non planar surface. There are electrodes 16 formed over the active regions 8 and electrodes 18 formed over the isolation regions 12. The electrodes are covered by a dielectric layer 14 such as silicon dioxide or the like.

Figure 2:
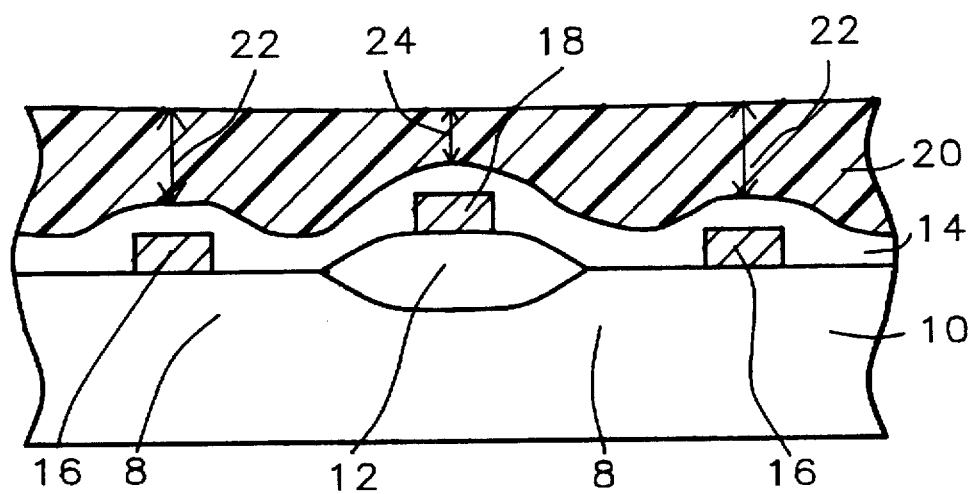
FIG. 2 shows a cross section view of an integrated circuit wafer having active regions and isolation regions with a layer of photoresist formed on the wafer.

In order to make contact to the electrodes 18 contact holes must be formed in the dielectric layer 14. To accomplish this a layer of photoresist 20 is formed over the dielectric layer 14, see FIG. 2. Due to the non planar surface of the integrated circuit wafer the thickness 22 of the photoresist over the active regions 8 of the wafer is greater than the thickness 24 of the photoresist over the isolation regions 12 of the wafer. The layer of photoresist 20 is then exposed using the antireflection mask of this invention. The exposed photoresist is then developed and the contact holes are formed.

Refer now to FIG. 5, there is shown an embodiment of the antireflection mask of this invention which will be used to expose the photoresist. A patterned layer of opaque material 44 is formed on a transparent mask substrate 42, such as quartz having a thickness of between about 4.5 and 4.8 millimeters. The opaque material is a material such as chrome having a thickness of between about 700 and 800 Angstroms. The patterned layer of opaque material 44 has first mask openings 46 which will be used to expose the thicker photoresist over the active regions of the wafer and second mask openings 48 which will be used to expose the thinner photoresist over the isolation regions of the wafer.

A patterned layer of antireflection material 50 is formed over the patterned layer of opaque material 44 such that antireflection material 50 covers the second mask openings 48 in the patterned layer of opaque material 44 but does not cover the first mask openings 46 in the patterned layer of opaque material 44. The layer of antireflection material 50 is formed of a material such as TiN having a thickness of between about 300 and 500 Angstroms. The layer of antireflection material 50 has a light transmittance of between about 70% and 80% for wavelength of light used to illuminate the mask.

A beam of light 40, such as from an i line source of 3650 Angstroms, is used to illuminate the mask. The light 52 passing through the first mask openings 46 is used to expose the thicker photoresist over the active region of the wafer and is not attenuated by the mask. The light 54 passing through the second mask openings 48 is used to expose the thinner photoresist over the isolation regions of the wafer and is attenuated by the antireflection material 50. The attenuation of the antireflection material compensates for the thickness variation of the photoresist.

Figure 3:
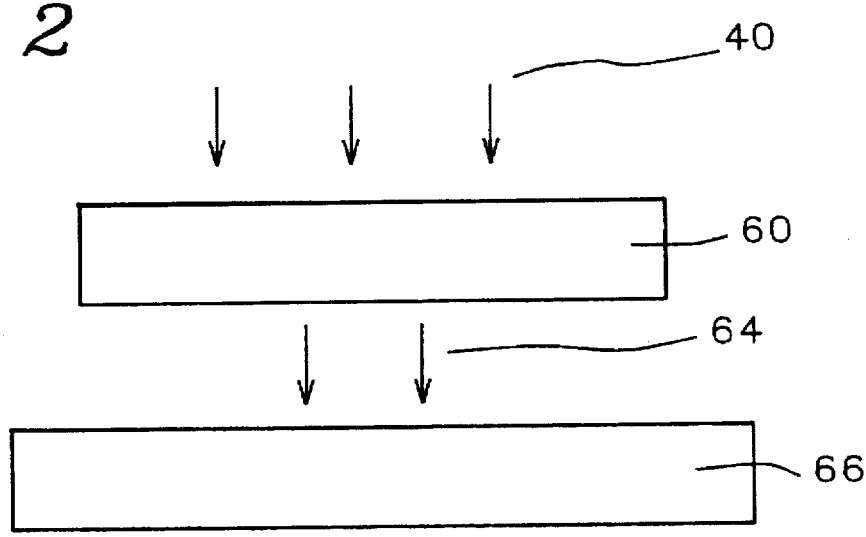
FIG. 3 shows a block diagram of a tool used to expose a layer of photoresist on an integrated circuit wafer.

Refer now to FIGS. 3 and 5, there is shown an embodiment of a method of exposing a layer of photoresist using the antireflection mask of this invention. FIG. 3 shows a block diagram of an exposure tool such as a 5 times reduction stepper. A light beam 40 illuminates the antireflection mask 60. The light 64 passing through the antireflection mask 60 is focussed on an integrated circuit wafer 66 and exposes a layer of photoresist. The photoresist is then developed for wafer processing.

As shown in FIG. 5, a light beam 40 illuminates the transparent mask substrate 42 of the antireflection mask from the side opposite the layer of patterned opaque material 44. Light 52 passing through the first mask openings 46 is not attenuated and is focussed on regions of the integrated circuit wafer where the layer of photoresist is thicker. Light 54 passing through the second mask openings 48 also passes through the patterned antireflection layer 50 and is attenuated before being focussed on the regions of the integrated circuit wafer where the layer of photoresist is thinner. The patterned antireflection layer 50 reduces reflections from the patterned opaque layer and compensates for the thickness variations of the layer of photoresist.

While the invention has been particularly shown and described with reference to the preferred embodiments thereof, it will be understood by those skilled in the art that various changes in form and details may be made without departing from the spirit and scope of the invention.

What is claimed is:

1. A mask for processing an integrated circuit wafer, comprising:

a transparent mask substrate having a first pattern region and a second pattern region;

a patterned layer of opaque material formed on said transparent mask substrate wherein said patterned layer of opaque material has a first pattern in said first pattern region of said transparent mask substrate and a second pattern in said second pattern region of said transparent mask substrate; and a patterned layer of antireflection material formed over said second pattern formed in said patterned layer of opaque material wherein said antireflection material is a partially transmitting material, covers said second pattern region of said transparent mask substrate, and does not cover said first pattern region of said transparent mask substrate.

2. The mask of claim 1 wherein said transparent mask substrate is quartz.

3. The mask of claim 1 wherein said patterned layer of opaque material is chrome having a thickness of between about 700 and 800 Angstroms.

4. The mask of claim 1 wherein said patterned layer of antireflection material is TiN having a thickness of between about 300 and 500 Angstroms.

5. The mask of claim 1 wherein said patterned layer of antireflection material has a light transmittance of between about 70% and 80% for light having a wavelength of about 3650 Angstroms.

6. The mask of claim 1 wherein light passing through said first pattern region of said transparent mask substrate is used to expose said first pattern in thicker regions of a layer of photoresist having thickness variations.

7. The mask of claim 6 wherein said first pattern consists of a pattern of contact holes.

8. The mask of claim 1 wherein light passing through said second pattern region of said transparent mask substrate and said patterned layer of antireflection material is used to expose said second pattern in thinner regions of a layer of photoresist having thickness variations.

9. The mask of claim 8 wherein said thinner regions of a layer of photoresist having thickness variations are formed over field oxide regions of an integrated circuit wafer.

10. The mask of claim 8 wherein said second pattern consists of a pattern of contact holes.

11. A method of forming features on an integrated circuit wafer, comprising the steps of:

providing a transparent mask substrate having a first pattern region and a second pattern region;

providing a patterned layer of opaque material formed on said transparent mask substrate wherein said patterned layer of opaque material has a first pattern in said first pattern region of said transparent mask substrate and a second pattern in said second pattern region of said transparent mask substrate;

providing a patterned layer of antireflection material formed over said second pattern formed in said patterned layer of opaque material wherein said antireflection material is a partially transmitting material, covers said second pattern region of said transparent mask substrate, and does not cover said first pattern region of said transparent mask substrate;

providing an integrated circuit wafer having active regions and isolation regions;

forming a layer of photoresist having first feature regions and second feature regions on said integrated circuit wafer wherein said first feature regions of said layer of photoresist are directly over said active regions of said integrated circuit wafer and said second feature regions of said layer of photoresist are directly over said isolation regions of said integrated circuit wafer;

exposing said first feature regions of said layer of photoresist by means of light passing through said first pattern region of said transparent mask substrate;

exposing said second feature regions of said layer of photoresist by means of light passing through said second pattern region of said transparent mask substrate and said patterned layer of antireflection material;

developing said layer of photoresist after exposing said first feature regions of said layer of photoresist and said second feature regions of said layer of photoresist;

forming first features over said active regions of said integrated circuit wafer using said first feature regions of said developed layer of photoresist as a mask; and forming second features over said isolation regions of said integrated circuit wafer using said second feature regions of said developed layer of photoresist as a mask.

12. The method of claim 11 wherein said transparent mask substrate is quartz.

13. The method of claim 11 wherein said patterned layer of opaque material is chrome having a thickness of between about 700 and 800 Angstroms.

14. The method of claim 11 wherein said patterned layer of antireflection material is TiN having a thickness of between about 300 and 500 Angstroms.

15. The method of claim 11 wherein said patterned layer of antireflection material has a light transmittance of between about 70% and 80% for light having a wavelength of about 3650 Angstroms.

16. The method of claim 11 wherein said first features are contact holes.

17. The method of claim 11 wherein said isolation regions of said integrated circuit wafer are field oxide regions.

18. The method of claim 11 wherein said second features are contact holes.

* * * * *